United States Patent [19]

Bennett

[11] 4,378,510

[45] Mar. 29, 1983

[54] MINIATURIZED ACCELEROMETER WITH PIEZOELECTRIC FET

[75] Inventor: Charles E. Bennett, Scottsdale, Ariz.

[73] Assignee: Motorola Inc., Schaumburg, Ill.

[21] Appl. No.: 169,540

[22] Filed: Jul. 17, 1980

[51] Int. Cl.³ ............................................. H01L 29/84
[52] U.S. Cl. ................................. 310/329; 73/517 R; 310/32; 357/26
[58] Field of Search .................... 357/23, 26; 310/329, 310/338, 311, 321, 326, 338, 329; 73/517 R; 367/157; 364/821

[56] References Cited

U.S. PATENT DOCUMENTS

| | | | |
|---|---|---|---|
| 3,170,076 | 2/1965 | Wing | 310/326 |
| 3,294,988 | 12/1966 | Packard | 357/26 |
| 3,351,786 | 11/1967 | Muller et al. | 357/26 |
| 3,426,424 | 2/1969 | Touchy | 310/338 |
| 3,569,747 | 3/1971 | Siegel | 310/329 |
| 3,585,415 | 6/1971 | Muller et al. | 310/329 |
| 3,818,426 | 6/1974 | Bonnett et al. | 340/5 MP |
| 3,973,146 | 8/1976 | Arnold et al. | 357/26 |
| 3,978,508 | 8/1976 | Vilkomerson | 357/26 |
| 4,047,214 | 9/1977 | Francombe et al. | 357/26 |
| 4,104,921 | 8/1978 | Nissl | 310/329 |

OTHER PUBLICATIONS

Greeneich et al. "Theoretical Transducer Properties of Piezoelectric Insulator FET Transducers," Jap. v. 46, No. 11, Nov. 1975.
Roylance, L. E. et al., "A Batch-Fabricated Silicon Accelerometer", IEEE Trans. on Electron Devices vol. ED-26, No. 12, Dec. 1979.

Primary Examiner—J. D. Miller
Assistant Examiner—D. L. Rebsch
Attorney, Agent, or Firm—Eugene A. Parsons; M. David Shapiro

[57] ABSTRACT

An accelerometer comprising a piezoelectric device hard mounted to the gate electrode of a field effect transistor, thus avoiding the capacitance of an interconnecting coaxial cable connection and providing, therefore, improved frequency response in a smaller, more efficient package.

2 Claims, 3 Drawing Figures

MINIATURIZED ACCELEROMETER WITH PIEZOELECTRIC FET

FIELD OF THE INVENTION

The invention relates to a small accelerometer utilizing a piezoelectric material mounted directly on a MOS-FET and utilized as the gate element thereof.

BACKGROUND OF THE INVENTION

Contemporary accelerometers utilize coaxial cables which have an associated capacitance that tends to dominate the device. For this reason these accelerometers and their monitoring systems are inherently large and difficult to apply. The losses associated with the coaxial cables require that extensive amplification be provided at the output end of the coaxial cable. Cable capacity in such systems also limits the useful upper frequency. Sensitivity of the device is also limited by the capacitance.

Strain gauges comprising a combination of piezoelectric and FET devices have been taught, for example, in U.S. Pat. Nos. 3,351,786 and 3,585,415 by R. S. Muller et al. "Theoretical Transducer Properties of Piezoelectric Insulator FET Transducers", by Greeneich and Muller, *Journal of Applied Physics*, Vol. 46, No. 11, November, 1975, also teaches this combination for use as a strain gauge. These teachings are restricted to relatively thin piezoelectric devices which are suitable for strain gauge use but would not have enough response to acceleration/deceleration forces to be useful in accelerometer applications.

SUMMARY OF THE INVENTION

The above and other problems associated with contemporary accelerometers are resolved by means of the instant invention in that a piezoelectric device, the sensor of the system, is coupled directly to a MOSFET type semiconductor so that it is utilized simultaneously as the gate input to the MOSFET device thereby eliminating any need for a coaxial cable connection. The voltage generated by the piezoelectric element while under the influence of an acceleration or deceleration force is transmitted directly to the MOSFET device and thus controls the geometric configuration of the diffused channel therein.

Therefore it is an object of the instant invention to provide a small integrated accelerometer/amplifier combination which may be manufactured in integrated circuit form.

It is another object of the invention to provide a small integral accelerometer which is relatively efficient in terms of sensitivity and frequency response.

It is still another object of the invention to provide an integral accelerometer/amplifier combination in integrated circuit form which is easy to produce and therefore low in cost.

These and other objects of the invention may be more readily understood upon study of the Detailed Description of the Invention, below, taken together with the drawings in which.

DETAILED DESCRIPTION OF THE INVENTION

Figure 1:
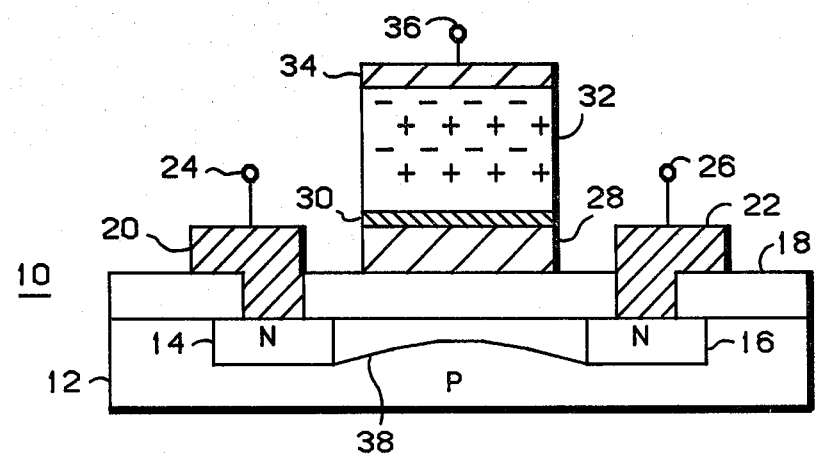
FIG. 1 is a cross-section of the invention shown under no acceleration forces.

FIG. 1 depicts a cross-section of the invention 10 in a relaxed or non-accelerated environment. Device 10 comprises substrate 12 which may be of P type semiconductor material with source 14 and drain 16 diffused therein. Silicon dioxide insulator layer 18 covers and protects P substrate 12, source 14 and drain 16 with suitable openings where electrical contact material 20 and 22 is deposited in order to make electrical contact to source 14 and drain 16, respectively. Terminals 24 and 26 are shown schematically and are the useful terminal connections to metallic patterns 20 and 22. Gate electrode 28 is deposited on silicon dioxide insulator 18 in a well known manner. Piezoelectric material 32 is bonded to metallic gate 28 by means of brazing alloy 30 which may be Ag-Au. Metallization layer 34 on piezoelectric device 32 provides an electrical connection to terminal 36, the gate input. It will be clearly recognized that P substrate 12, source 14, drain 16, insulator 18, and metallization 20, 22 and 28 comprise a field effect transistor (FET) device. With a suitable terminal added to the gate input 28, the device might be wired as an amplifier, which would be well known. However the addition of piezoelectric material 32 and metallization layer 34 provides an integrated sensor which may be used to translate an acceleration force into a variable voltage applied to gate 28. However, in order for device 10, as shown in FIG. 1, to work as a combination acceleration/deceleration sensor and amplifier, it is necessary that the thickness of piezoelectric device 32 be sufficient to provide adequate output voltage levels which have a significant effect on diffused channel 38. Typically substrate 12 may have a thickness of from 10 to 15 mils. Piezoelectric device 32 must have a thickness in the range of from 100 to 200 mils in order to develop a large enough output voltage to provide the necessary field effect in diffused layer 38. Therefore it may be seen that the thickness ratio of piezoelectric device 32 with respect to P substrate 12 must be on the order of from five to twenty times in the preferred embodiment of the invention, as shown. The added thickness of the piezoelectric device over the strain gauge devices known in the prior art provide two basic functional differences:

(1) The mass of the piezoelectric material is increased, thus providing greater changes in thickness and output voltage under the influence of acceleration/deceleration forces, and (2) The output voltage is further improved because it is a function of piezoelectric thickness.

The addition of mass in the form of metallization layer 34 also enhances the output voltage and, hence, the charge change in diffused channel 38 of the FET. Of course, it will be understood that the increased thickness of metallization layer 34 and piezoelectric material 32 makes the device stiffer or more rigid and it tends to resist bending and twisting forces so that the total device is not suitable for use as a strain gauge as were the thinner prior art devices.

Figure 2:
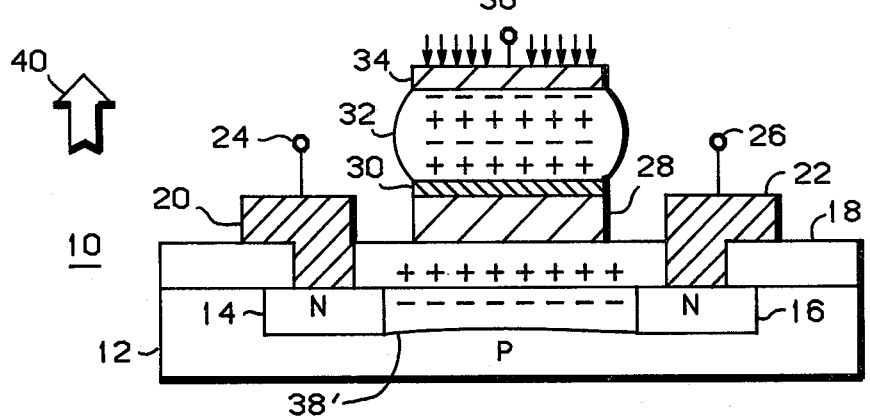
FIG. 2 is the cross-section of FIG. 1 as shown under the influence of a positive acceleration force.
Figure 3:
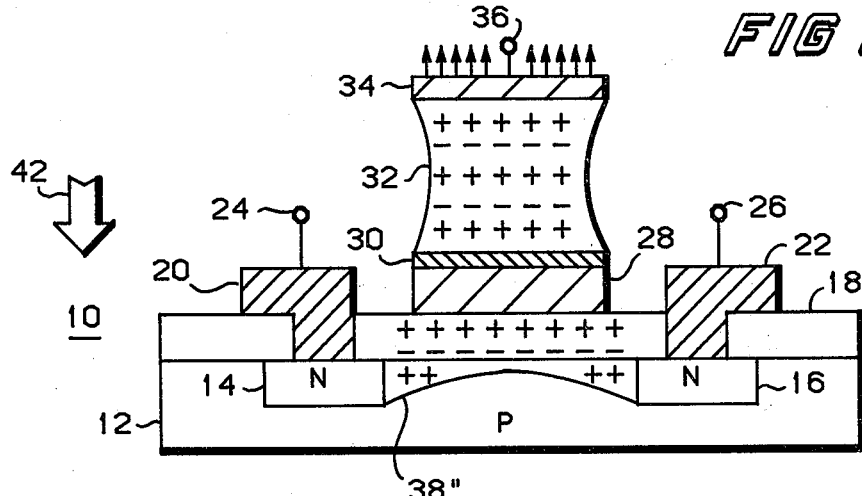
FIG. 3 is the invention of FIG. 1 shown under the influence of a negative acceleration force.

FIG. 2 is illustrative of the invention under conditions of positive acceleration 40. The mass of metallic surface 34 and piezoelectric device 32 in combination cause piezoelectric device 32 to compress, as shown. This generates a charge in diffusion area 38' which increases the depth of the diffusion channel. Therefore the current flow from source 14 to drain 16 is enhanced. Conversely, as shown in FIG. 3, under conditions of negative acceleration 42 the masses of metallic layer 34 and piezoelectric device 32 tend to expand or stretch piezoelectric device 32, as shown, thereby decreasing the charge in diffusion layer 38" and restricting the current flow from sink 14 to source 16. The action described allows acceleration and deceleration forces on piezoelectric device 32 to be translated into increased or decreased current flow, respectively, between sink 14 and drain 16. When FET device 10 is connected into a conventional amplifier circuit (not shown), the change in current heretofore described is amplified many times and the output voltage is responsive to the input acceleration and deceleration forces. Since essentially no increase in capacity is present at gate 28 of FET 10, the frequency response of the combined device is significantly enhanced over that of prior art systems in which the piezoelectric device is connected to the gate by means of a coaxial cable. It should also be recognized that the system of FIG. 1 is extremely compact compared to prior art devices and thus may be used in applications where there would otherwise not be enough space available for installation of prior art devices.

While the invention has been particularly shown and described with reference to a preferred embodiment thereof, it will be understood by those skilled in the art that various other modifications and changes may be made to the present invention from the principles of the invention described above without departing from the spirit and scope thereof, as encompassed in the accompanying claims. Therefore, it is intended in the appended claims to cover all such equivalent variations as come within the scope of the invention as described.

I claim:

1. An accelerometer comprising:
a metal-oxide-semiconductor field-effect-transistor having a substrate, a source, a drain and an insulated gate; said gate further comprising piezoelectric means mounted thereon for sensing at least one of positive and negative acceleration, said piezoelectric means having a thickness being substantially greater than a thickness of said substrate.

2. The accelerometer according to claim 1 wherein said thickness of said piezoelectric means is in a range of from 5 to 20 times greater than said substrate thickness.

* * * * *